United States Patent
Tsyrganovich

[19]

[11] Patent Number: 6,018,273
[45] Date of Patent: Jan. 25, 2000

[54] EXTERNALLY-SYNCHRONIZED VOLTAGE-CONTROLLED OSCILLATOR IN PHASE LOCKED LOOP

[75] Inventor: Anatoliy V. Tsyrganovich, San Jose, Calif.

[73] Assignee: Zilog, Inc., Campbell, Calif.

[21] Appl. No.: 08/951,139

[22] Filed: Oct. 15, 1997

[51] Int. Cl.[7] .................................................. H03L 7/06
[52] U.S. Cl. ........................ 331/2; 331/1 A; 327/144; 327/147; 375/376
[58] Field of Search ................... 331/1 A, 2, 20, 331/49; 327/144, 147, 141, 142; 375/373, 376, 354, 360

[56] References Cited

U.S. PATENT DOCUMENTS

| | | | |
|---|---|---|---|
| 4,305,045 | 12/1981 | Metz et al. | 331/1 A |
| 4,675,617 | 6/1987 | Martin | 331/1 A |
| 5,237,290 | 8/1993 | Banu et al. | 331/2 |

FOREIGN PATENT DOCUMENTS 2138564  12/1994  Canada .

*Primary Examiner*—Arnold Kinkead
*Attorney, Agent, or Firm*—Majestic, Parsons, Siebert & Hsue

[57] ABSTRACT

A phase locked loop is described which uses a first and second voltage-controlled oscillator. The first voltage-controlled oscillator is input into a feedback circuit which is used to produce a control signal. The control signal runs both the first and second voltage-controlled oscillators. A synchronization circuit is used to synchronize the first voltage-controlled oscillator with the synchronization pulse. In one embodiment, the synchronization circuit can use the second voltage-controlled oscillator to produce a timing interval to control the turning on and off of the second voltage-controlled oscillator in order to facilitate this synchronization. Because the output of the first voltage-controlled oscillator is sent to the feedback, the output of the phase locked loop will not drift due to parameter differences between the first and second voltage-controlled oscillators. In one embodiment, the second voltage-controlled oscillator is used to produce a single-cycle delay signal, which aids in the synchronization of the first voltage-controlled oscillator with the synchronization pulse.

25 Claims, 4 Drawing Sheets

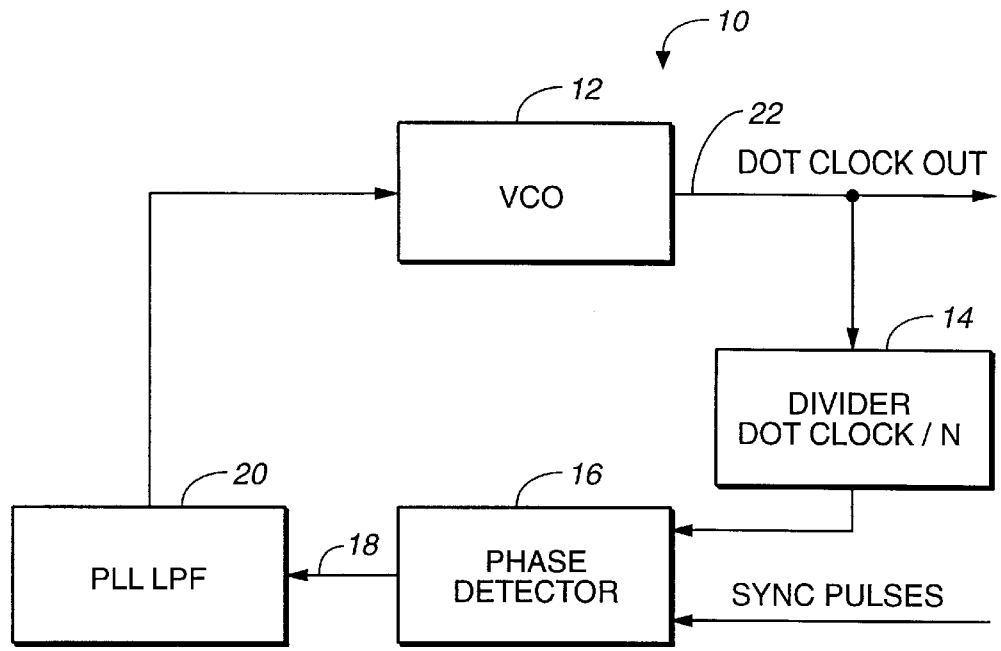
FIG._1
*(PRIOR ART)*
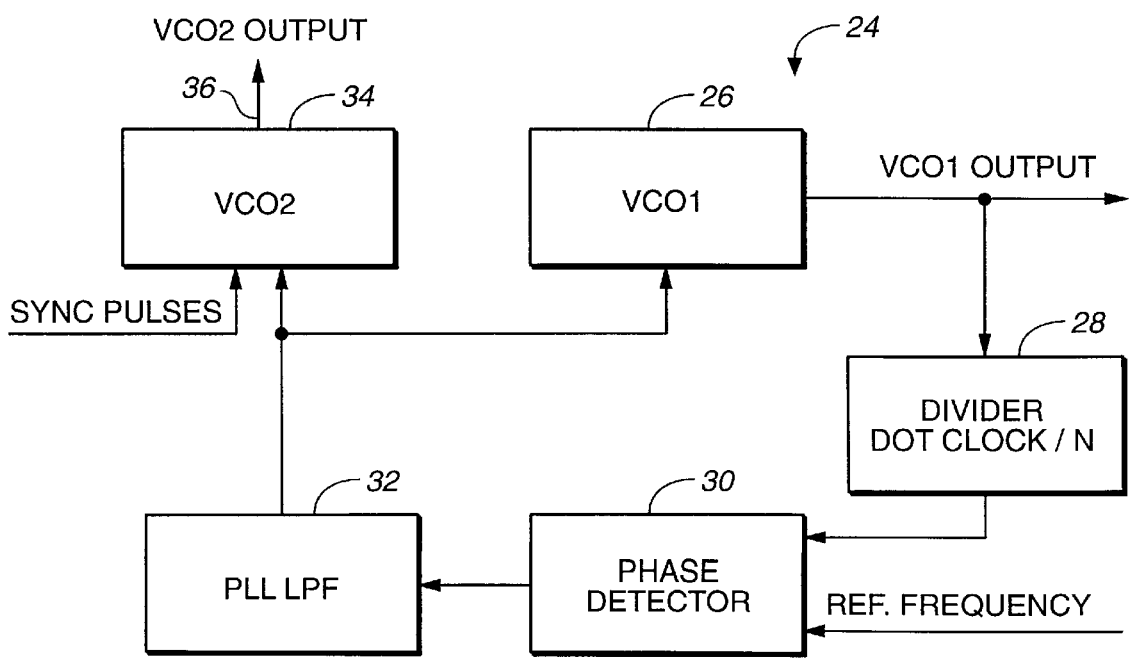
FIG._2
*(PRIOR ART)*

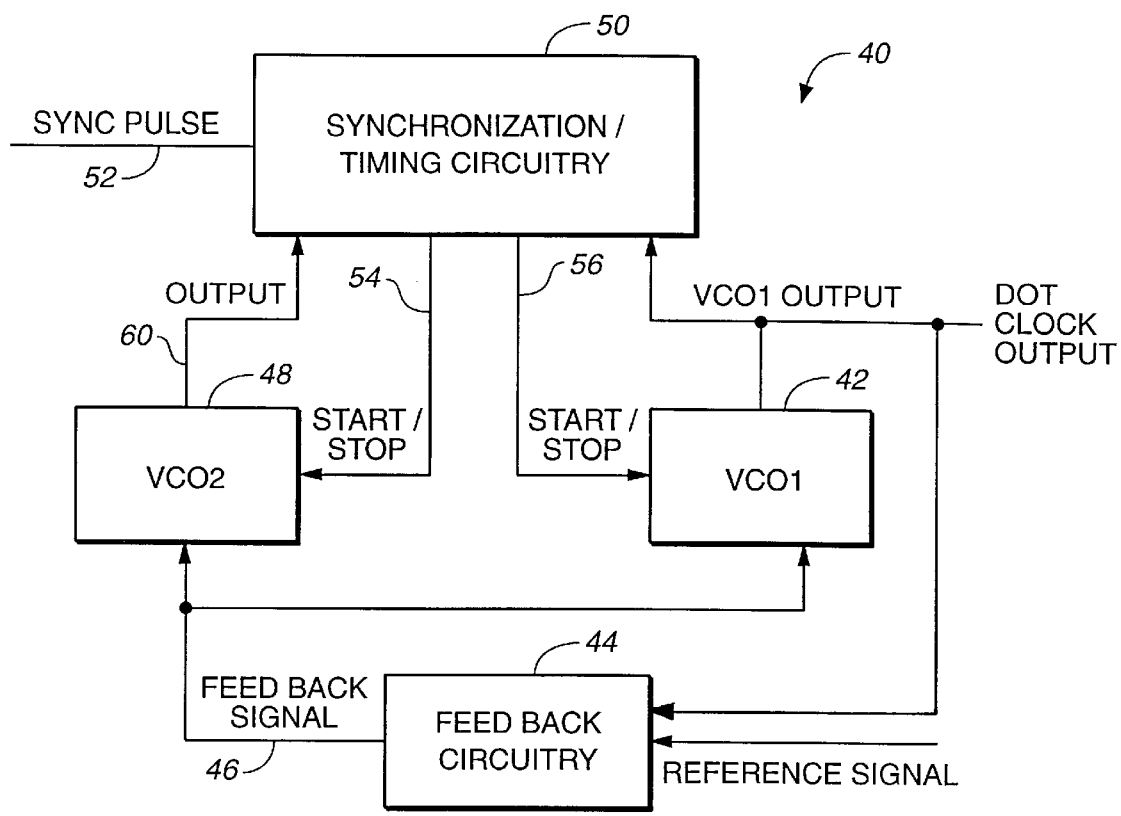
FIG._3
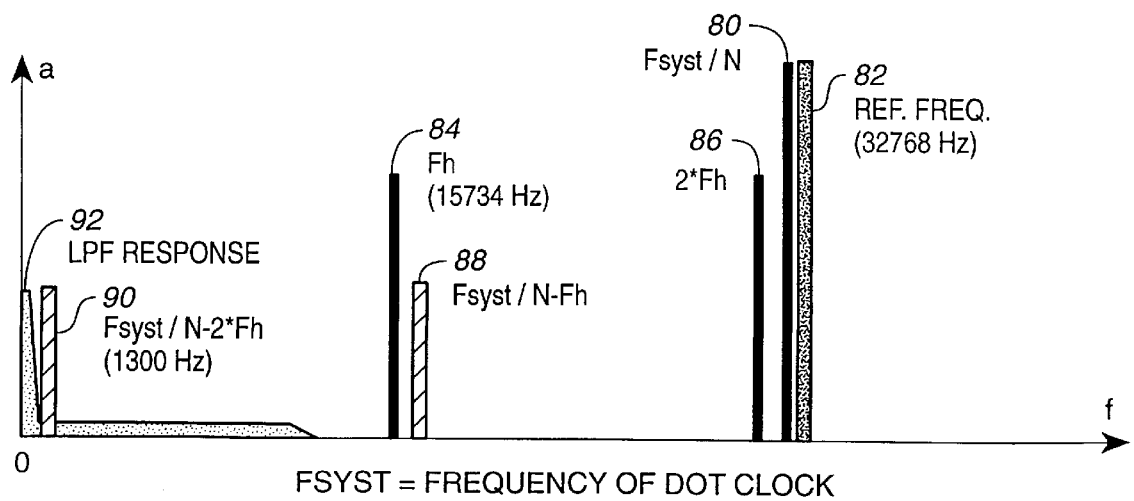
FIG._6

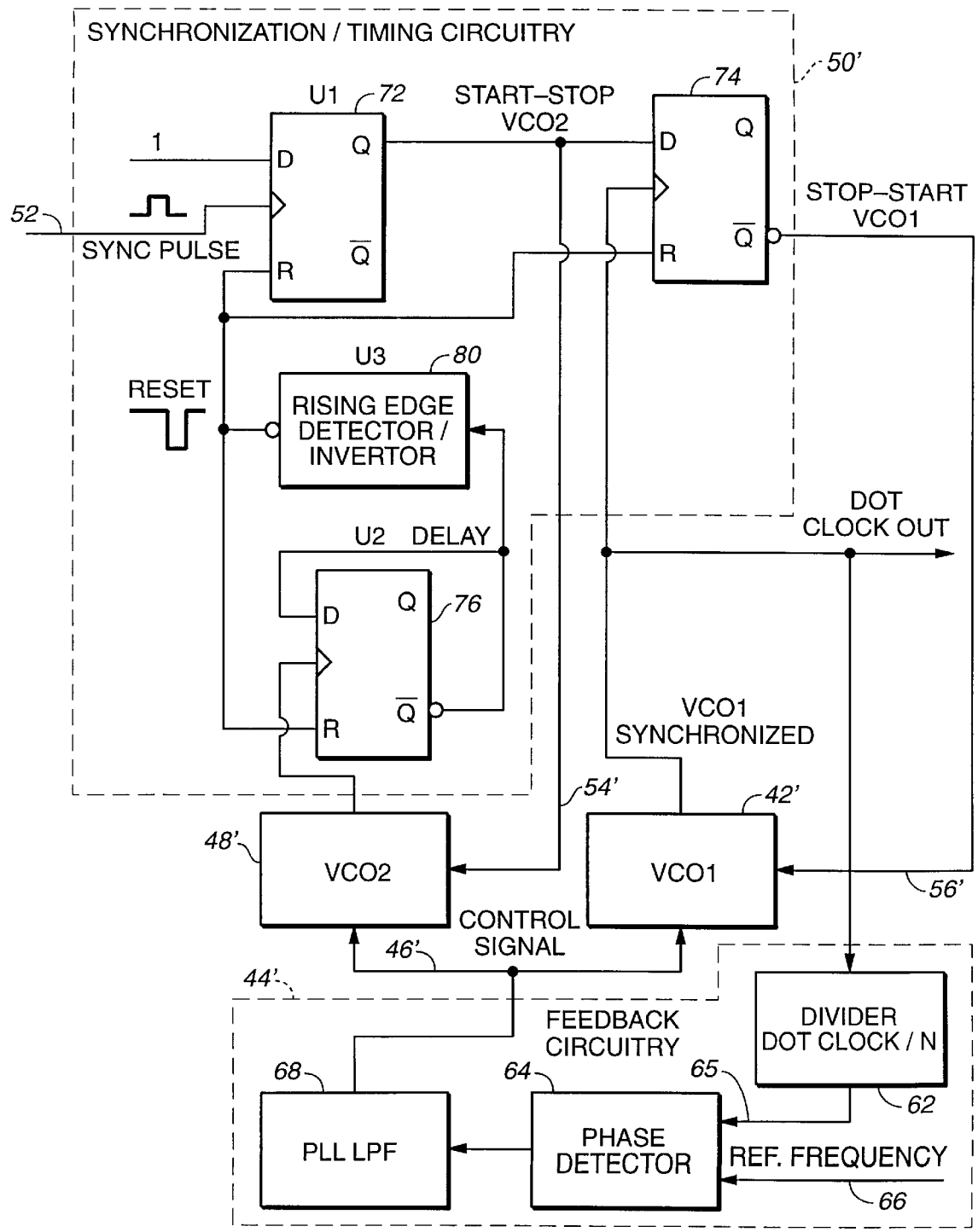
FIG._4

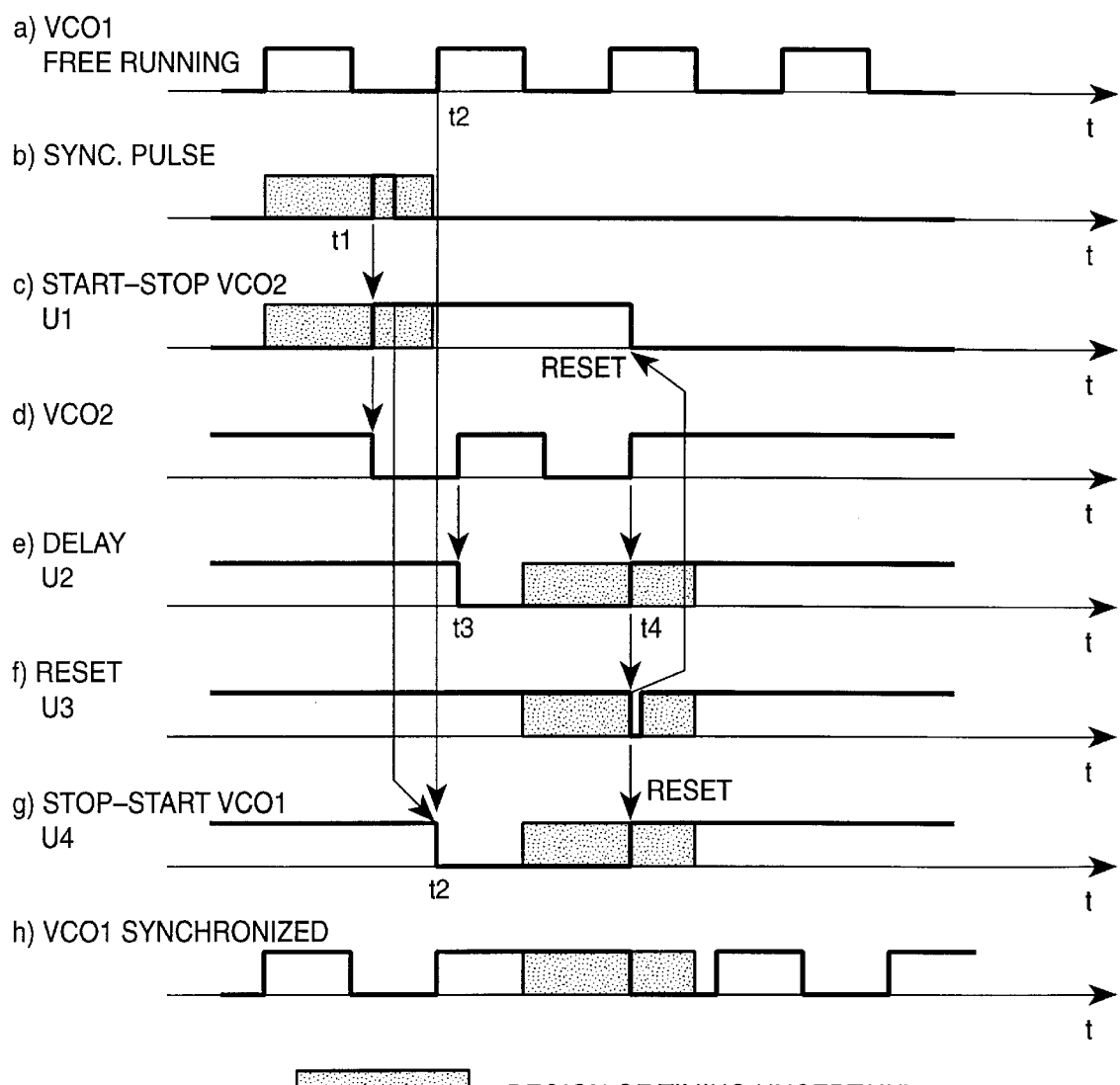
FIG._5

EXTERNALLY-SYNCHRONIZED VOLTAGE-CONTROLLED OSCILLATOR IN PHASE LOCKED LOOP

BACKGROUND OF THE INVENTION

The present invention relates to voltage-controlled oscillators, especially voltage-controlled oscillators used in a phase locked loop circuitry.

An example of phase locked loop circuitry is shown in FIG. 1. The phase locked loop 10 includes a voltage-controlled oscillator 12. The output of the voltage-controlled oscillator is sent to a divider 14. The divider produces one output pulse for every N input pulses. The output of the divider is compared with an input sync pulse in phase detector 16. Phase detector 16 produces a correction signal on line 18 which is sent to the low-pass filter (LPF) 20. The filtered control signal, such as a control voltage, is used to control the frequency of the output of the voltage-controlled oscillator (VCO) 12. The output on line 22 of the voltage-controlled oscillator 12 will have a frequency approximately "N" times the frequency of the sync pulses.

FIG. 2 shows an another prior-art phase locked loop circuit 24. Phase locked loop circuit 24 is used in systems when the frequency of the voltage-controlled oscillator is not a harmonic of the horizontal sync ($H_{sync}$) and another frequency is used for reference. A dot clock is used, for example, to generate the onscreen display (OSD) in a television application when there is no incoming video signal. In that case, a reference frequency from a crystal oscillator can be used. Looking at FIG. 2, the output of the first voltage-controlled oscillator 26 is sent to the divide-by-N counter 28. The output of the divide-by-N counter 28 is compared in the phase detector 30 with a reference frequency from a crystal oscillator. The correction signal is filtered in a low-pass filter 32 and sent to both the first voltage-controlled oscillator 26 and the second voltage-controlled oscillator 34. The second voltage-controlled oscillator 34 is synchronized using the sync pulses. Independently of the sync pulses' stability, the second voltage-controlled oscillator output at line 36 will be in phase with the sync pulses.

This approach relies on the first and second voltage-controlled oscillator having identical characteristics. The output of the first voltage-controlled oscillator is sent to the feedback loop, but the output of the second voltage-controlled oscillator is not. In fact, both voltage-controlled oscillators will inevitably have different parameters, especially the sensitivities to the control signal and to the noise. If the phase locked loop circuit is used in a television application, the difference in VCO parameters can cause differences in the OSD size due to differences in frequency of the second voltage-controlled oscillator output.

It is desired to have a phase locked loop system that avoids the OSD size problem of the circuit of FIG. 2 while allowing for the use of an external sync pulse signal for phase synchronization.

SUMMARY OF THE INVENTION

The method of the present invention uses a synchronizing circuit to control the turning on and off of a first voltage-controlled oscillator, so that the output of the first voltage-controlled oscillator is synchronized to a sync pulse and so that the output of the first voltage-controlled oscillator is fed through the feedback circuit to produce the control signal.

The control signal can be fed to both the first voltage-controlled oscillator and a second voltage-controlled oscillator. The output of the second voltage-controlled oscillator produces a timing signal used by the synchronizing circuit.

In one embodiment, the synchronizing circuit turns on the second voltage-controlled oscillator after a synchronizing pulse is received. When the first voltage-controlled oscillator completes a cycle, it is turned off. Next, after one full cycle of the second voltage-controlled oscillator, the first voltage-controlled oscillator is re-started such that it is synchronized with the second voltage-controlled oscillator and thus with the sync pulse.

In this manner, the output of the first voltage-controlled oscillator is both synchronized with the sync pulse and controlled by feedback circuitry connected to the output of the first voltage-controlled oscillator. Since the output of the feedback circuit is used to control the voltage-controlled oscillator which produces the output of the circuit, the differing parameter characteristics of the first and second voltage-controlled oscillators is less of a problem. The timing period controlled by the second VCO is relatively short so the error caused by parameter differences does not have a chance to accumulate.

In the some prior art phase locked loops, such as the one shown in FIG. 2, the output of the second voltage-controlled oscillator is used as the system output. Since the parameter characteristics of the first and second voltage-controlled oscillator can be different, the output of the second voltage-controlled oscillator can drift away from the frequency of the desired output. When the phase locked loop system is used in a television set, this can result in a deviation of the OSD size of the television signal when the output of the second voltage-controlled oscillator is used as the dot clock.

In a preferred embodiment of the present invention, a single cycle of a second voltage-controlled oscillator is used to synchronize the first voltage-controlled oscillator. In this way, the error in the output signal is not accumulated over multiple cycles.

The phase locked loop circuitry of the present invention can be used to produce a dot clock output which can be used in a television encoder or decoder or in an on-screen display generating circuit.

In a preferred embodiment of the present invention, the synchronizing circuitry does not allow the output of the voltage-controlled oscillator to have an abbreviated cycle. One undesirable way to operate the phase locked loop would be to reset the first voltage-controlled oscillator as soon as a sync pulse is received. This can result in an abbreviated VCO output cycle. Because the output of the phase locked loop is used as a clock, abbreviated cycles are undesirable since they can adversely affect the operation of the circuit clocked with the output.

BRIEF DESCRIPTION OF THE DRAWINGS

The above and other features and aspects of the present invention will become more apparent upon reading the following detailed description in conjunction with the accompanying drawings.

FIG. 1 is a diagram of a prior art phase locked loop circuit.

FIG. 2 is a diagram of another prior art phase locked loop circuit using two voltage-controlled oscillators.

FIG. 3 is a diagram of a phase locked loop circuit of the present invention.

FIG. 4 is a diagram of an embodiment of the phase locked loop circuit of the present invention.

FIG. 5 is a timing diagram for the phase locked loop circuit of FIG. 4.

FIG. 6 is a frequency domain representation of the synchronized voltage-controlled oscillator in a phase locked loop circuit.

DETAILED DESCRIPTION OF THE PREFERRED EMBODIMENT

FIG. 3 is a diagram of the phase locked loop circuit 40 of the present invention. In this circuit, the output of a first voltage-controlled oscillator 42 is sent to a feedback circuitry 44 which produces a control signal on line 46. The control signal can be an analog or digital signal. The control signal is sent to a first voltage-controlled oscillator 42 and a second voltage-controlled oscillator 48. A synchronization/timing circuit 50 receives the output from the first and second voltage-controlled oscillators and receives sync pulses across line 52. The synchronization circuitry 50 is used to synchronize the first voltage-controlled oscillator 42 with the sync pulse 52 and to use the second voltage-controlled oscillator 48 to produce a timing interval that aids in the synchronization of the first voltage-controlled oscillator.

In one embodiment, the synchronization/timing circuitry 50, once it receives a sync pulse on line 52, will start the second voltage-controlled oscillator along line 54. Once the first voltage-controlled oscillator 42 completes an output cycle, circuitry 50 sends a signal along line 56 to turn off the first voltage-controlled oscillator 42. After this time, the circuitry 50 waits a timing interval of a full cycle of the second voltage-controlled oscillator output on line 60. At this time, the first voltage-controlled oscillator 42 is re-started by the circuitry 50.

In this manner, the output of the first voltage-controlled oscillator 42 is synchronized with the sync pulse 54. Unlike the prior art phase locked loop circuit of FIG. 2, the phase locked loop 40 of FIG. 3 has a feedback circuitry 44 which is fed by the output of the phase locked loop. Thus, the differing parameter characteristics of the first voltage-controlled oscillator 42 and the second voltage-controlled oscillator 48 are only a concern during the short timing interval produced by the second voltage-controlled oscillator 48.

The details of the preferred embodiment of the present invention can best be understood with respect to FIGS. 4 and 5. FIG. 4 is a diagram of a preferred embodiment of the phase locked loop circuit of the present invention. The output of the first voltage-controlled oscillator 42' is sent to the feedback circuit 44'. In the preferred embodiment, the feedback circuitry 44' includes a divide-by-N counter 62 which produces a single output pulse for every N input pulses, and a phase detector 64 which compares the signal on line 65 with the reference signal on line 66. The reference signal can be supplied by a crystal oscillator. The output of the phase detector 64 is filtered in the low-pass filter 68 to produce a control signal on line 70. This control signal is sent both to the first voltage-controlled oscillator 42' and the second voltage-controlled oscillator 48'. The synchronization/timing circuitry 50' includes flip-flops 72, 74 and 76, as well as rising edge detector inverter 80.

The operation of the synchronizing/timing circuitry 52' can be best seen with respect to FIG. 5. FIG. 5 is a timing diagram for the phase locked loop circuit of FIG. 4. At time t1, a sync pulse is received on line 52' as seen in FIG. 5B. This sync pulse can be received by the synchronization and timing circuitry at any point during a cycle of the first voltage-controlled oscillator 42' output. The region of timing uncertainty for the synchronization pulse is thus shown as the shaded timing region in FIG. 5B. The sync pulse on line 52' clocks the flip-flop 72 and causes a start signal to be sent along line 54' to the second voltage-controlled oscillator 48'. As shown in FIG. 5B, this starts the second voltage-controlled oscillator.

At time t2, after the sync pulse is received by the system, flip-flop 74 is clocked by the output of the first voltage-controlled oscillator 42'. Since the second voltage-controlled oscillator 48' is on, line 54' is high and thus when the flip-flop 74 is clocked, a stop signal is sent along line 56' to the first voltage-controlled oscillator 42'. The first voltage-controlled oscillator 42' is turned off and kept in the high state.

Note that stopping the first voltage-controlled oscillator 42' at time t1 can cause a short negative pulse at the first voltage-controlled oscillator output, because stopping the first voltage-controlled oscillator 42 switches the output to a high level. To avoid such a short negative pulse, the stopping of the first voltage-controlled oscillator is synchronized with the rising edge of the first voltage-controlled oscillator at time T2.

At time T3, the output of the second voltage-controlled oscillator 48' causes flip-flop 76 to clock, producing a low value for the delay U2 as shown in FIG. 5E. On the next downward-edge transition of the output of the second voltage-controlled oscillator 48', flip-flop 76 produces a high inverted-output on delay U2. This causes the rising-edge-detector/inverter 80 to produce a reset pulse, as shown in FIG. 5F. The reset pulse causes flip-flop 74 to re-start the first voltage-controlled oscillator 42', and thus, as shown in FIG. 5H, the first voltage-controlled oscillator 42' is synchronized with the sync pulse. Note that the system relies upon the operation of the second voltage-controlled oscillator 48' only during the single cycle between times t3 and t4. Thus, the different parameter characteristics of the first voltage-controlled oscillator 42' and the second voltage-controlled oscillator 48' do not accumulate over multiple cycles.

Multiple different types of circuits can be used as the feedback circuitry 44 and the synchronization/timing circuitry 50. For example, the feedback circuitry 44 could in some embodiments not include the divide-by-N counter if the reference signal has a high enough frequency. Additionally, the circuitry 50' shown in FIG. 4 is only one embodiment of hardware that can be used to do the synchronization of the first voltage-controlled oscillator 42' using the output of the second voltage-controlled oscillator 48'.

FIG. 6 illustrates the frequency domain representation of the synchronized voltage-controlled oscillator of the phase locked loop of FIG. 4. $F_{syst}$ is the frequency of the dot-clock. $F_{syst}/N$ 80 is the frequency of the signal on line 66. The reference frequency $F_{ref}$ 82 is the frequency on the reference frequency line 66. There is a slight difference between these two frequencies, which is used to produce the error signal. $F_h$ 84 is the frequency of the horizontal sync signal. Different harmonics are shown, including the doubled-horizontal sync frequency, $2F_h$ 86, the $(F_{syst}/N-F_h)$ frequency 88, and the $(F_{syst}/N-2F_h)$ frequency 90. In the example shown in FIG. 6, the $(F_{syst}/N-2F_h)$ frequency 90 is about 1300 Hz. This beating frequency can be easily filtered by the low-pass filter response 92 of the low-pass filter 68 in the feedback circuitry 44' shown in FIG. 4.

Various details of the implementation and method are merely illustrative of the invention. It will be understood that various changes in such details may be within the scope of the invention, which is to be limited only by the appended claims.

What is claimed is:

1. An apparatus comprising:
    a first and second voltage-controlled oscillator with start/stop input and control signal input, the control signal input controlling the frequency of each voltage-controlled oscillator output;
    a feedback circuit connected to the output of the first voltage-controlled oscillator for producing a control signal for the first and second voltage-controlled oscillators, the feedback circuit including a reference frequency input; and
    circuitry attached to the outputs of the first and second voltage-controlled oscillators and to a sync pulse line and producing outputs connected to the start/stop inputs of the first and second voltage-controlled oscillators, the circuitry adapted to use the sync pulse to turn on the second voltage-controlled oscillator for a timing interval and to use the output of the second voltage-controlled oscillator to turn on the first-voltage-controlled oscillator after the timing interval so that the first voltage-controlled oscillator is synchronized with sync pulses on the sync pulse line.

2. The apparatus of claim 1, wherein the control signal produced by the feedback circuit is a voltage control signal.

3. The apparatus of claim 1, wherein the control signal produced by the feedback circuit is a digital control signal.

4. The apparatus of claim 1, wherein the sync pulses are produced from a horizontal sync of the video signal, and wherein the output of the first voltage-controlled oscillator is a dot clock.

5. The apparatus of claim 1, wherein the circuitry turns on the first voltage-controlled oscillator at a second upward transition of the second voltage-controlled oscillator output.

6. The apparatus of claim 1, wherein the circuitry includes a delay circuitry to ensure that the output of the first voltage-controlled oscillator does not include an abbreviated pulse period.

7. The apparatus of claim 6, wherein the delay circuitry includes a reset circuit connected to reset flip-flops in the circuitry.

8. The apparatus of claim 7, wherein the second voltage-controlled oscillator controls the reset circuit to produce a reset pulse to the flip-flops.

9. The apparatus of claim 1, wherein the feedback circuit includes a divide-by-N counter.

10. The apparatus of claim 1, wherein the feedback circuit further includes a phase detector.

11. The apparatus of claim 1, wherein the feedback circuit further includes a low-pass filter.

12. A method comprising:
    providing first and second voltage-controlled oscillators;
    supplying a control signal to the first and second voltage-controlled oscillators from a feedback circuit input with the output of the first voltage-controlled oscillator and a reference frequency input;
    turning on the second voltage-controlled oscillator when a sync pulse is received;
    thereafter, turning off the first voltage-controlled oscillator on a first voltage-controlled oscillator output transition; and
    thereafter, turning on the first voltage-controlled oscillator on a second voltage-controlled oscillator output transition so that the first voltage-controlled oscillator is synchronized to the sync pulse.

13. The method of claim 12, wherein the first voltage-controlled oscillator is turned off at a next upward transition of the first voltage-controlled oscillator output after a sync pulse is received.

14. The method of claim 12, wherein the first voltage-controlled oscillator is turned on at a second upward transition of the second voltage-controlled oscillator output.

15. The method of claim 12, wherein the sync pulses are produced from a horizontal sync of the video signal, and wherein the output of the first voltage-controlled oscillator is a dot clock.

16. The method of claim 12, wherein the output of the first voltage-controlled oscillator does not include an abbreviated pulse period.

17. The method of claim 12, wherein the output of the first voltage-controlled oscillator is used to produce a feedback signal to control the first and second voltage-controlled oscillators.

18. An apparatus comprising:
    a first and second voltage-controlled oscillator with start/stop inputs and control signal inputs, each control signal input controlling the frequency of each voltage-controlled oscillator output;
    a feedback circuit connected to the output of the first voltage-controlled oscillator for producing a control signal for the first and second voltage-controlled oscillators, the feedback circuit using a reference frequency input; and
    synchronizing circuitry attached to the outputs of the first and second voltage-controlled oscillators and to a sync pulse line and producing outputs connected to the start/stop inputs of the first and second voltage-controlled oscillators, the synchronizing circuitry adapted to synchronize the output of the first voltage-controlled oscillator with sync pulses on the sync pulse line.

19. The apparatus of claim 18, wherein the synchronizing circuitry is adapted to the sync pulses on the sync pulse line to turn on the second voltage-controlled oscillator for a timing interval to use the output of the second voltage-controlled oscillator to turn on the first voltage-controlled oscillator after the timing interval so that the first voltage-controlled oscillator is synchronized with sync pulses on the sync pulse line.

20. The apparatus of claim 19, wherein the synchronizing circuitry turns off the first voltage-controlled oscillator on a next upward transition of the first voltage-controlled oscillator output after a sync pulse is received.

21. The apparatus of claim 19, wherein the synchronizing circuitry turns on the first voltage-controlled oscillator on a second upward transition of the second voltage-controlled oscillator output.

22. A method comprising:
   providing a first and second voltage-controlled oscillator;
   supplying a control signal to the first and second voltage-controlled oscillators from a feedback circuit input with the output of the first voltage-controlled oscillator and a reference frequency input; and
   synchronizing the output of the first voltage-controlled oscillator with sync pulses on a sync pulse line by using the second voltage-controlled oscillator to define a timing period and wherein the synchronizing step comprises turning on the second voltage-controlled oscillator when a sync pulse is received and thereafter, turning off the first voltage-controlled oscillator on a first voltage-controlled oscillator output transition.

23. The method of claim 22 wherein the synchronizing step further comprises turning on the first voltage-controlled oscillator on a second voltage-controlled oscillator output transition so that the first voltage-controlled oscillator is synchronized to the sync pulse.

24. The method of claim 23, wherein the first voltage-controlled oscillator is turned off at a next upward transition of the first voltage-controlled oscillator output after a sync pulse is received.

25. The method of claim 23, wherein the first voltage-controlled oscillator is turned on at a second upward transition of the second voltage-controlled oscillator output.

* * * * *